United States Patent Office 3,444,015

Patented May 13, 1969

3,444,015

METHOD OF ETCHING TANTALUM

Evelyn B. Baker, West Chester, and Walter O. Freitag, Conshohocken, Pa., assignors to Sperry Rand Corporation, New York, N.Y., a corporation of Delaware No Drawing. Filed Mar. 4, 1965, Ser. No. 437,290
Int. Cl. C23f *1/02*
U.S. Cl. 156—11 1 Claim

ABSTRACT OF THE DISCLOSURE

In accordance with this invention it has been found that fuming sulfuric acid or oleum is an improved etchant for tantalum. More particularly, in accordance with this invention it has been found that in an operation wherein a tantalum surface, such as a tantalum surface presented by metallic tantalum deposited on an inert substrate, is etched by the application of a liquid etchant thereto, improved results are obtained by employing fuming sulfuric acid as the etchant.

This invention relates to the etching of tantalum surfaces. More particularly, this invention relates to the etching of thin films of tantalum. Still more particularly, this invention relates to an improved method of etching thin films of tantalum, such as tantalum films having a thickness in the range 100–10,000 A, and higher by means of a liquid etchant which is applied to the tantalum surface at the area to be etched.

In accordance with one embodiment this invention is directed to the etching of thin films of tantalum or the fabrication of tantalum thin film circuits. In accordance with another embodiment this invention is directed to an improved etchant for the etching of tantalum surfaces, particularly thin films of tantalum.

It has been the practice heretofore in the manufacture and fabrication of resistor networks and other microcircuits embodying or using thin films of tantalum to employ hydrogen fluoride containing photolithographic etching solutions. Unfortunately many substrate materials upon which it is desirable to deposit or otherwise associate therewith thin films of tantalum as circuit elements or components are sensitive to or are attacked by hydrogen fluoride and solutions containing hydrogen fluoride, such as photolithographic etching solutions. Such substrate materials include quartz, glass, silicon and various ceramic glazes. Accordingly, such materials are not suitable for use in the manufacture of tantalum thin film structures or circuits when employed as a substrate for or otherwise associated with tantalum in operations which require the etching of tantalum with a hydrogen fluoride containing etchant.

It is therefore an object of this invention to provide an improved etchant, and process employing the same, for the etching of tantalum surfaces, such as thin films of tantalum.

Another object of this invention is to provide an improved technique and method for the fabrication of structures comprising etched tantalum surfaces and/or etched thin films, and the like, of tantalum.

Yet another object of this invention is to provide an improved and flexible technique for the etching of tantalum.

How these and other objects of this invention are achieved will become apparent in the light of the accompanying disclosure. In at least one embodiment of the practice of this invention at least one of the foregoing objects will be achieved.

In accordance with this invention it has been found that fuming sulfuric acid or oleum is an improved etchant for tantalum. More particularly, in accordance with this invention it has been found that in an operation wherein a tantalum surface, such as a tantalum surface presented by metallic tantalum deposited on an inert substrate, is etched by the application of a liquid etchant thereto, improved results are obtained by employing fuming sulfuric acid as the etchant.

Liquid fuming sulfuric acid or oleum essentially comprises sulfuric acid containing dissolved sulfur trioxide. Sulfur trioxide is soluble in substantially all proportions in sulfuric acid. In general, however, fuming sulfuric acid or oleum containing up to about 65% sulfur trioxide dissolved therein, such as fuming sulfuric acid containing about 1–25% by weight sulfur trioxide, yields satisfactory results in the practice of this invention. Fuming sulfuric acid or oleum, however, containing a higher percentage by weight sulfur trioxide dissolved therein also is suitable for use in the practice of this invention. In the application of the fuming sulfuric acid to the tantalum surface to be etched it is generally desirable that the fuming sulfuric acid be at a relatively elevated temperature during the etching operation, such as a temperature in the range 110–150° C., more or less. Maintaining the temperature of the fuming sulfuric acid at about 135° C. during the etching operation is preferred, however.

Although various techniques may be employed for the application of the liquid fuming sulfuric acid to the tantalum surface to be etched it is usually preferred to carry out the etching operation by immersing the structure or substrate providing the tantalum surface to be etched in the fuming sulfuric acid.

Numerous inert, inorganic substrate materials may be employed as the carrier or the substrate upon which the tantalum may be deposited or otherwise associated to provide the tantalum surface to be etched. Suitable substrate materials which are inert to fuming sulfuric acid and which provide a suitable substrate surface for the deposition of tantalum thereon include glass, quartz, alumina, silicon, Teflon, a polyfluoroethylene, silicon coated with a film of thermally grown $SiO_2$, and the various ceramic glazes.

The following is illustrative of the practice of this invention as directed to the etching of thin films of tantalum and the fabrication of tantalum thin film circuits. A suitable substrate material, such as glass or a silicon wafer, after having been cleaned and otherwise conventionally prepared has deposited thereon a continuous film of tantalum. A continuous film of metallic tantalum, such as tantalum film having a thickness in the range 50–100 A. upwards to about 10,000–20,000 A., and higher, can suitably be deposited upon the substrate by conventional techniques, such as cathode sputtering or vacuum evaporation and subsequent deposition of metallic tantalum upon the substrate.

Following the deposition of the film of tantalum upon the substrate material a continuous film of a noble metal, such as platinum, palladium and the like, preferably gold, is deposited over the tantalum. The initial deposition of the film of noble metal on the tantalum film may be effected by conventional techniques, such as vacuum evaporation and deposition. If desired, the thickness of the initially deposited film of noble metal may be enhanced or increased by subsequent electrodeposition or electrodes deposition of additional noble metal.

Following the deposition of the film of noble metal onto the tantalum film, a desired pattern, such as a circuit pattern, is etched into the noble metal film using conventional and standard photoresist techniques to expose the underlying tantalum film in the desired pattern. The resulting treated substrate material, now provided with areas of exposed tantalum and other areas wherein the tantalum film is covered with a film of noble metal, such as gold, is immersed into fuming sulfuric acid containing 20% by weight sulfur trioxide or oleum or fuming sulfuric acid is otherwise directly applied to the areas of the treated substrate presenting exposed tantalum surfaces. Desirably, the fuming sulfuric acid is applied to the exposed tantalum surfaces at a temperature in the range from 110° C. to about 150° C., preferably 135° C., although higher or lower temperatures may be employed.

Upon the application of the fuming sulfuric acid to the exposed tantalum surfaces the tantalum is etched or otherwise removed by the fuming sulfuric acid, thereby exposing the underlying substrate surface.

Desirably, a second standard or conventional photoetch proecedure may again be carried out on other selected areas of the film of noble metal to expose additional selected other areas of tantalum.

When the above-described technique is employed for the fabrication of tantalum thin film circuits, such as microcircuits on the substrate material, the thus-subsequently exposed tantalum areas are useful as resistors in the microcircuit and those areas of the tantalum film still covered or protected by the overlying film of noble metal, such as gold, are useful as conductors. It is thus seen that the above technique provides a flexible and improved method of fabricating thin film structures, such as tantalum thin film microcircuits and the like, or substrate materials, particularly hydrogen fluroride sensitive substrate materials, not heretofore generally employed in the fabrication of tantalum thin film structures.

Although emphasis in the description of this invention has been placed upon the use of fuming sulfuric acid or oleum as the liquid etchant for tantalum satisfactory results would also appear to be obtaintable by the use of liquid sulfur trioxide, particularly the commercially available stabilized liquid sulfur trioxides.

As will be apparent to those skilled in the art in the light of the foregoing disclosure, many alterations, substitutions and modifications are possible in the practice of this invention without departing from the spirit or scope thereof.

The embodiments of the invention in which an exclusive property or privilege is claimed are defined as follows.

We claim:

1. A method of preparing tantalum thin film structures, circuits and the like which comprises vapor depositing a film of tantalum on an inert substrate material selected from the group consisting of glass, quartz, alumina, silicon, silicon coated with a film of thermally grown $SiO_2$, polyfluoroethylene and ceramic glazes, said tantalum having a thickness in the range from about 100 Angstrom units to about 20,000 Angstrom units, vapor depositing a film of gold on to the previously deposited tantalum film, said gold film, having a thickness such that said film is useful as a mask and as a conductor, photolithographically etching at selected locations said gold film to expose said tantalum film at said locations, applying fuming sulfuric acid containing up to about 65% by weight sulfur trioxide dissolved therein at a temperature in the range from about 110° C. to about 150° C. to the exposed tantalum film at said locations by immersing the thus coated and treated substrate material in a body of said fuming sulphuric acid to remove said tantalum film at said locations and again photolithographically etching said gold film at other selected locations to expose the underlying tantalum film at said other locations, the exposed tantalum film at said other locations being suitable as resistors and the remaining portions of said tantalum film having a gold film deposited thereon and being useful as conductors.

References Cited

UNITED STATES PATENTS

| | | | |
|---|---|---|---|
| 2,731,333 | 1/1956 | Ko et al. | 156—3 |
| 2,758,074 | 8/1956 | Black et al. | 156—3 |
| 3,256,588 | 6/1966 | Siking et al. | 29—155.5 |

OTHER REFERENCES

Condensed Chemical Dictionary 6th ed., © 1961, p. 1106, Rheinhold Publishing Corporation, New York.

JACOB H. STEINBERG, *Primary Examiner.*

U.S. Cl. X.R.

96—38.4; 156—3, 17, 18